US011990170B2

(12) United States Patent
Wang et al.

(10) Patent No.: US 11,990,170 B2
(45) Date of Patent: May 21, 2024

(54) WEAK FIELD STIMULATED SKYRMION NUCLEATION AND MANIPULATION FOR SPINTRONIC MEMORY AND PROCESSING DEVICES

(71) Applicant: OHIO STATE INNOVATION FOUNDATION, Columbus, OH (US)

(72) Inventors: Binbin Wang, Columbus, OH (US); David McComb, Columbus, OH (US)

(73) Assignee: OHIO STATE INNOVATION FOUNDATION, Columbus, OH (US)

( * ) Notice: Subject to any disclaimer, the term of this patent is extended or adjusted under 35 U.S.C. 154(b) by 250 days.

(21) Appl. No.: 17/693,551

(22) Filed: Mar. 14, 2022

(65) Prior Publication Data

US 2022/0366955 A1 Nov. 17, 2022

Related U.S. Application Data

(60) Provisional application No. 63/187,470, filed on May 12, 2021.

(51) Int. Cl.
*G11C 11/16* (2006.01)
*G11C 11/18* (2006.01)

(52) U.S. Cl.
CPC ........ *G11C 11/1675* (2013.01); *G11C 11/161* (2013.01); *G11C 11/18* (2013.01)

(58) Field of Classification Search
CPC ... G11C 11/1675; G11C 11/161; G11C 11/18; G11C 11/1673; H10N 50/85
See application file for complete search history.

(56) References Cited

U.S. PATENT DOCUMENTS 11,069,390 B2 * 7/2021 Hu ............... H01F 10/3254

FOREIGN PATENT DOCUMENTS

CN 107221597 A * 6/2017 ............ H01L 43/10
WO WO2022243458 A1 * 11/2022 ............ G11C 11/16

OTHER PUBLICATIONS

Nagaosa, N.; Tokura, Y. Topological Properties and Dynamics of Magnetic Skyrmions. Nature Nanotechnology. Nature Publishing Group 2013, pp. 899-911. https://doi.org/10.1038/nnano.2013.243.
(Continued)

*Primary Examiner* — Donald H B Braswell
(74) *Attorney, Agent, or Firm* — Meunier Carlin & Curfman LLC

(57) ABSTRACT

Aspects herein are directed to nucleating skyrmions in spintronic materials by dynamic manipulation of an in-plane magnetic field and related design of prototype devices for spintronic memory and processing. Different from conventional phase transition methods, nucleating and manipulating skyrmion using in-plane fields and spin current pulses is described. For example, in a material with rotatable anisotropy and asymmetry geometric confinement, a skyrmion can be nucleated by switching the in-plane fields. This has been experimentally confirmed in a centrosymmetric magnet, $Fe_3Sn_2$, with an engineered thickness gradient.

18 Claims, 5 Drawing Sheets

(56) References Cited

OTHER PUBLICATIONS

Zhang, X.; Zhou, Y.; Song, K. M.; Park, T. E.; Xia, J.; Ezawa, M.; Liu, X.; Zhao, W.; Zhao, G.; Woo, S. Skyrmion-Electronics: Writing, Deleting, Reading and Processing Magnetic Skyrmions toward Spintronic Applications. Journal of Physics Condensed Matter. Institute of Physics Publishing Apr. 3, 2020. https://doi.org/10.1088/1361-648X/ab5488.

Heinze, S.; Von Bergmann, K.; Menzel, M.; Brede, J.; Kubetzka, A.; Wiesendanger, R.; Bihlmayer, G.; Blügel, S. Spontaneous Atomic-Scale Magnetic Skyrmion Lattice in Two Dimensions. Nat. Phys. 2011, 7 (9), 713-718. https://doi.org/10.1038/nphys2045.

Okubo, T.; Chung, S.; Kawamura, H. Multiple-q States and the Skyrmion Lattice of the Triangular-Lattice Heisenberg Antiferromagnet under Magnetic Fields. Phys. Rev. Lett. 2012, 108 (1), 017206. https://doi.org/10.1103/PhysRevLett.108.017206.

Leonov, A. O.; Mostovoy, M. Multiply Periodic States and Isolated Skyrmions in an Anisotropic Frustrated Magnet. Nat. Commun. 2015, 6 (1), 1-8. https://doi.org/10.1038/ncomms9275.

Yu, X.; Mostovoy, M.; Tokunaga, Y.; Zhang, W.; Kimoto, K.; Matsui, Y.; Kaneko, Y.; Nagaosa, N.; Tokura, Y. Magnetic Stripes and Skyrmions with Helicity Reversals. Proc. Natl. Acad. Sci. U. S. A. 2012, 109 (23), 8856-8860. https://doi.org/10.1073/pnas.1118496109.

Hirschberger, M.; Nakajima, T.; Gao, S.; Peng, L.; Kikkawa, A.; Kurumaji, T.; Kriener, M.; Yamasaki, Y.; Sagayama, H.; Nakao, H.; Ohishi, K.; Kakurai, K.; Taguchi, Y.; Yu, X.; Arima, T. hisa; Tokura, Y. Skyrmion Phase and Competing Magnetic Orders on a Breathing Kagomé Lattice. Nat. Commun. 2019, 10 (1), 1-9. https://doi.org/10.1038/s41467-019-13675-4.

Hou, Z.; Zhang, Q.; Xu, G.; Gong, C.; Ding, B.; Wang, Y.; Li, H.; Liu, E.; Xu, F.; Zhang, H.; Yao, Y.; Wu, G.; Zhang, X. X.; Wang, W. Creation of Single Chain of Nanoscale Skyrmion Bubbles with Record-High Temperature Stability in a Geometrically Confined Nanostripe. Nano Lett. 2018, 18 (2), 1274-1279. https://doi.org/10.1021/acs.nanolett.7b04900.

Hou, Z.; Ren, W.; Ding, B.; Xu, G.; Wang, Y.; Yang, B.; Zhang, Q.; Zhang, Y.; Liu, E.; Xu, F.; Wang, W.; Wu, G.; Zhang, X.; Shen, B.; Zhang, Z. Observation of Various and Spontaneous Magnetic Skyrmionic Bubbles at Room Temperature in a Frustrated Kagome Magnet with Uniaxial Magnetic Anisotropy. Adv. Mater. 2017, 29 (29). https://doi.org/10.1002/adma.201701144.

Tang, J.; Kong, L.; Wu, Y.; Wang, W.; Chen, Y.; Wang, Y.; Li, J.; Soh, Y.; Xiong, Y.; Tian, M.; Du, H. Target Bubbles in Fe3Sn2Nanodisks at Zero Magnetic Field. ACS Nano 2020, 14 (9), 10986-10992. https://doi.org/10.1021/acsnano.0c04036.

Yu, X.; Tokunaga, Y.; Taguchi, Y.; Tokura, Y. Variation of Topology in Magnetic Bubbles in a Colossal Magnetoresistive Manganite. Adv. Mater. 2017, 29 (3). https://doi.org/10.1002/adma.201603958.

Wang, W.; Zhang, Y.; Xu, G.; Peng, L.; Ding, B.; Wang, Y.; Hou, Z.; Zhang, X.; Li, X.; Liu, E.; Wang, S.; Cai, J.; Wang, F.; Li, J.; Hu, F.; Wu, G.; Shen, B.; Zhang, X.-X. A Centrosymmetric Hexagonal Magnet with Superstable Biskyrmion Magnetic Nanodomains in a Wide Temperature Range of 100-340 K. Adv. Mater. 2016, 28 (32), 6887-6893. https://doi.org/10.1002/adma.201600889.

Sun, L.; Cao, R. X.; Miao, B. F.; Feng, Z.; You, B.; Wu, D.; Zhang, W.; Hu, A.; Ding, H. F. Creating an Artificial Two-Dimensional Skyrmion Crystal by Nanopatterning. Phys. Rev. Lett. 2013, 110 (16), 167201. https://doi.org/10.1103/PhysRevLett.110.167201.

Hou, Z.; Zhang, Q.; Xu, G.; Zhang, S.; Gong, C.; Ding, B.; Li, H.; Xu, F.; Yao, Y.; Liu, E.; Wu, G.; Zhang, X. X.; Wang, W. Manipulating the Topology of Nanoscale Skyrmion Bubbles by Spatially Geometric Confinement. ACS Nano 2019, 13 (1), 922-929. https://doi.org/10.1021/acsnano.8b09689.

Jiang, W.; Upadhyaya, P.; Zhang, W.; Yu, G.; Jungfleisch, M. B.; Fradin, F. Y.; Pearson, J. E.; Tserkovnyak, Y.; Wang, K. L.; Heinonen, O.; Te Velthuis, S. G. E.; Hoffmann, A. Blowing Magnetic Skyrmion Bubbles. Science (80-. ). 2015, 349 (6245), 283-286. https://doi.org/10.1126/science.aaa1442.

Yu, X.; Morikawa, D.; Tokunaga, Y.; Kubota, M.; Kurumaji, T.; Oike, H.; Nakamura, M.; Kagawa, F.; Taguchi, Y.; Arima, T. H.; Kawasaki, M.; Tokura, Y. Current-Induced Nucleation and Annihilation of Magnetic Skyrmions at Room Temperature in a Chiral Magnet. Adv. Mater. 2017, 29 (21). https://doi.org/10.1002/adma.201606178.

Finazzi, M.; Savoini, M.; Khorsand, A. R.; Tsukamoto, A.; Itoh, A.; Duò, L.; Kirilyuk, A.; Rasing, T.; Ezawa, M. Laser-Induced Magnetic Nanostructures with Tunable Topological Properties. Phys. Rev. Lett. 2013, 110 (17), 177205. https://doi.org/10.1103/PhysRevLett.110.177205.

Mn, J. X.; Zhang, S. S.; Li, H.; Jiang, K.; Chang, G.; Zhang, B.; Lian, B.; Xiang, C.; Belopolski, I.; Zheng, H.; Cochran, T. A.; Xu, S. Y.; Bian, G.; Liu, K.; Chang, T. R.; Lin, H.; Lu, Z. Y.; Wang, Z.; Jia, S.; Wang, W.; Hasan, M. Z. Giant and Anisotropic Many-Body Spin-Orbit Tunability in a Strongly Correlated Kagome Magnet. Nature. Nature Publishing Group Oct. 4, 2018, pp. 91-95. https://doi.org/10.1038/s41586-018-0502-7.

Ye, L.; Kang, M.; Liu, J.; Von Cube, F.; Wicker, C. R.; Suzuki, T.; Jozwiak, C.; Bostwick, A.; Rotenberg, E.; Bell, D. C.; Fu, L.; Comin, R.; Checkelsky, J. G. Massive Dirac Fermions in a Ferromagnetic Kagome Metal. Nature 2018, 555 (7698), 638-642. https://doi.org/10.1038/nature25987.

Han, M. G.; Garlow, J. A.; Liu, Y.; Zhang, H.; Li, J.; Dimarzio, D.; Knight, M. W.; Petrovic, C.; Jariwala, D.; Zhu, Y. Topological Magnetic-Spin Textures in Two-Dimensional van Der Waals Cr2Ge2Te6. Nano Lett. 2019, 19 (11), 7859-7865. https://doi.org/10.1021/acs.nanolett.9b02849.

Prosen, R. J.; Holmen, J. O.; Gran, B. E. Rotatable Anisotropy in Thin Permalloy Films Articles You May Be Interested in. J. Appl. Phys. 1961, 32, 91. https://doi.org/10.1063/1.2000512.

Lommel, J. M.; Graham, C. D. Rotatable Anisotropy in Composite Films. J. Appl. Phys. 1962, 33 (3), 1160-1161. https://doi.org/10.1063/1.1728641.

Garnier, L.-C.; Marangolo, M.; Eddrief, M.; Bisero, D.; Fin, S.; Casoli, F.; Pini, M. G.; Rettori, A.; Tacchi, S. Stripe Domains Reorientation in Ferromagnetic Films with Perpendicular Magnetic Anisotropy. J. Phys. Mater. 2020, 3 (2), 024001. https://doi.org/10.1088/2515-7639/ab6ea5.

Tacchi, S.; Fin, S.; Carlotti, G.; Gubbiotti, G.; Madami, M.; Barturen, M.; Marangolo, M.; Eddrief, M.; Bisero, D.; Rettori, A.; Pini, M. G. Rotatable Magnetic Anisotropy in a Fe 0.8 Ga 0.2 Thin Film with Stripe Domains: Dynamics versus Statics. Phys. Rev. B—Condens. Matter Mater. Phys. 2014, 89 (2), 024411. https://doi.org/10.1103/PhysRevB.89.024411.

Romming, N.; Hanneken, C.; Menzel, M.; Bickel, J. E.; Wolter, B.; Von Bergmann, K.; Kubetzka, A.; Wiesendanger, R. Writing and Deleting Single Magnetic Skyrmions. Science (80-. ). 2013, 341 (6146), 636-639. https://doi.org/10.1126/science.1240573.

Yoshimura, Y.; Kim, K. J.; Taniguchi, T.; Tono, T.; Ueda, K.; Hiramatsu, R.; Moriyama, T.; Yamada, K.; Nakatani, Y.; Ono, T. Soliton-like Magnetic Domain Wall Motion Induced by the Interfacial Dzyaloshinskii-Moriya Interaction. Nat. Phys. 2016, 12 (2), 157-161. https://doi.org/10.1038/nphys3535.

Peng, L.; Takagi, R.; Koshibae, W.; Shibata, K.; Nakajima, K.; Arima, T. hisa; Nagaosa, N.; Seki, S.; Yu, X.; Tokura, Y. Controlled Transformation of Skyrmions and Antiskyrmions in a Non-Centrosymmetric Magnet. Nature Nanotechnology. Nature Research Mar. 1, 2020, pp. 181-186. https://doi.org/10.1038/s41565-019-0616-6.

Yan, J. Q.; Sales, B. C.; Susner, M. A.; McGuire, M. A. Flux Growth in a Horizontal Configuration: An Analog to Vapor Transport Growth. Phys. Rev. Mater. 2017, 1 (2), 023402. https://doi.org/10.1103/PhysRevMaterials.1.023402.

Ishizuka, K.; Allman, B. Phase Measurement of Atomic Resolution Image Using Transport of Intensity Equation. J. Electron Microsc. (Tokyo). 2005, 54 (3), 191-197. https://doi.org/10.1093/JMICRO/DFI024.

\* cited by examiner

WEAK FIELD STIMULATED SKYRMION NUCLEATION AND MANIPULATION FOR SPINTRONIC MEMORY AND PROCESSING DEVICES

CROSS-REFERENCE TO RELATED APPLICATIONS

This application claims the benefit of U.S. provisional patent application No. 63/187,470, filed on May 12, 2021, and entitled "WEAK FIELD STIMULATED SKYRMION NUCLEATION AND MANIPULATION FOR SPINTRONIC MEMORY AND PROCESSING DEVICES," the disclosure of which is expressly incorporated herein by reference in its entirety.

STATEMENT OF GOVERNMENT SUPPORT

This invention was made with government support under grant/contract number D18AP00008 awarded by the Defense Advanced Research Projects Agency. The government has certain rights in the invention.

BACKGROUND

Magnetic skyrmions are topological excitations found in various material systems. In the past decade, they have demonstrated great potential in various applications including memory, logic, sensors, and quantum information processing. To realize the potential of skyrmion-based devices, it is essential to identify materials where small, stable skyrmions can be both created and manipulated reliably.

It is with respect to these and other considerations that the various aspects and embodiments of the present disclosure are presented.

SUMMARY

Aspects herein are directed to nucleating skyrmions in spintronic materials by dynamic manipulation of in-plane magnetic fields (or spin current pulses) and related design of prototype devices for spintronic memory and processing.

In an implementation, a method comprises: generating a skyrmion in a spintronic material; applying an in-plane magnetic field to the spintronic material; and nucleating the skyrmion by manipulation of the in-plane magnetic field or spin current pulses.

In an implementation, a device for spintronic memory and processing comprises: a spintronic material; and a skyrmion disposed within the spintronic material.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In the drawings.

DETAILED DESCRIPTION

Figure 1:
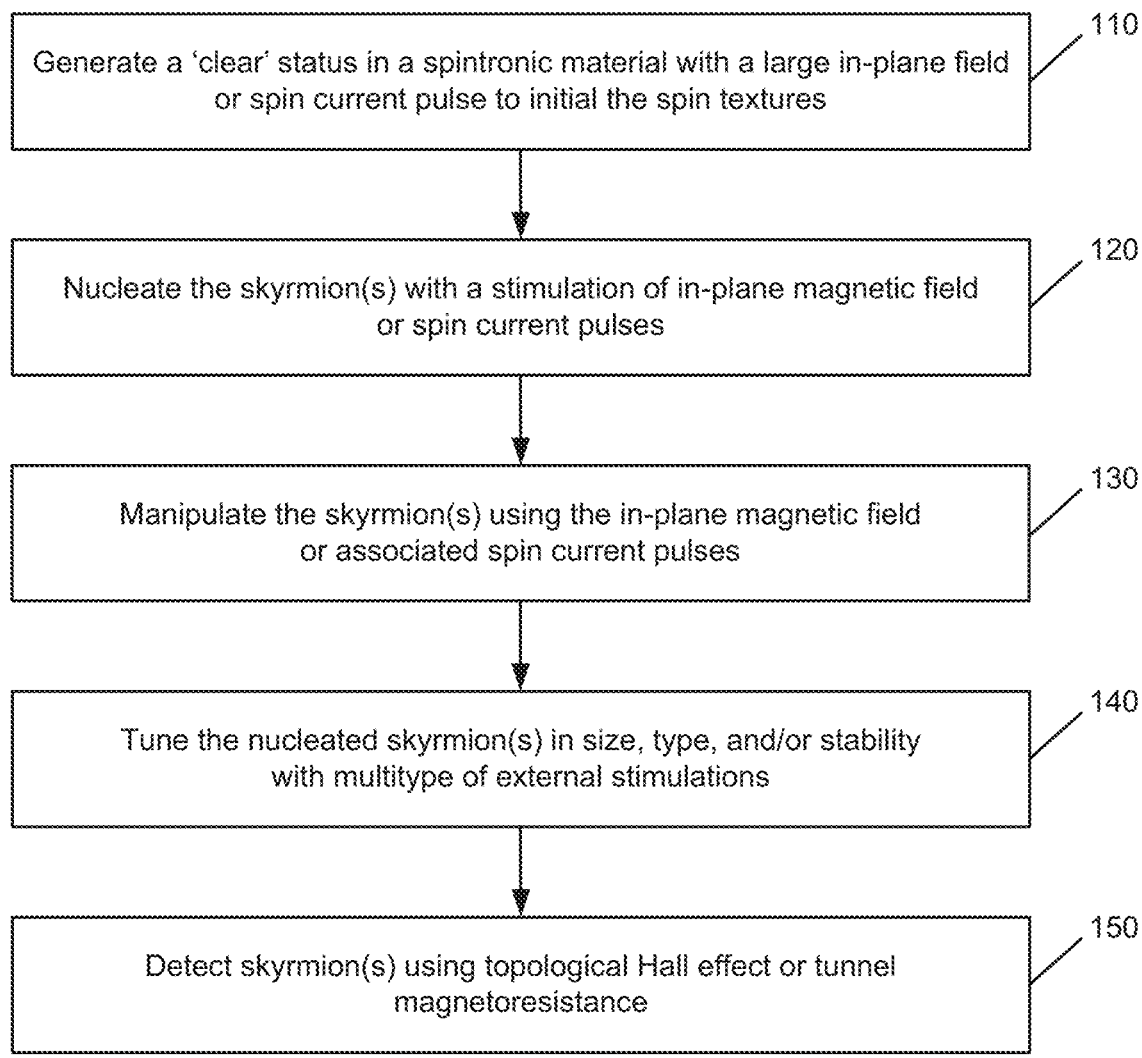
FIG. 1 is an operational flow of an implementation of a method of skyrmion nucleation and manipulation.

This description provides examples not intended to limit the scope of the appended claims. The figures generally indicate the features of the examples, where it is understood and appreciated that like reference numerals are used to refer to like elements. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein.

The following description of the disclosure is provided as an enabling teaching of the disclosure in its best, currently known embodiment(s). To this end, those skilled in the relevant art will recognize and appreciate that many changes can be made to the various embodiments of the invention described herein, while still obtaining the beneficial results of the present disclosure. It will also be apparent that some of the desired benefits of the present disclosure can be obtained by selecting some of the features of the present disclosure without utilizing other features. Accordingly, those who work in the art will recognize that many modifications and adaptations to the present disclosure are possible and can even be desirable in certain circumstances and are a part of the present disclosure. Thus, the following description is provided as illustrative of the principles of the present disclosure and not in limitation thereof.

Unless defined otherwise, all technical and scientific terms used herein have the same meaning as commonly understood to one of ordinary skill in the art to which this invention belongs. As used in the specification and claims, the singular form "a," "an," and "the" include plural references unless the context clearly dictates otherwise. As used herein, the terms "can," "may," "optionally," "can optionally," and "may optionally" are used interchangeably and are meant to include cases in which the condition occurs as well as cases in which the condition does not occur. Publications cited herein are hereby specifically incorporated by reference in their entireties and at least for the material for which they are cited.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed.

Different from conventional phase transition methods, nucleating and manipulating skyrmion using in-plane fields is described. For example, in a material with rotatable anisotropy and asymmetry geometric confinement, a skyrmion can be nucleated by switching the in-plane fields. This has been experimentally confirmed in a centrosymmetric magnet, $Fe_3Sn_2$, with an engineered thickness gradient. The techniques described herein allow to nucleate isolated skyrmions in $Fe_3Sn_2$ using in-plane fields (<5 mT) that are two orders of magnitude lower than the previously reported critical magnetic field (~800 mT). Skyrmions nucleated using the techniques described herein are tunable in size, type, and stability. Micromagnetic simulations combined with Lorentz transmission electron microscopy (LTEM) experiments reveal that the rotatable anisotropy and the difference of the response to the external in-plane field are critical factors for the skyrmion formation.

Understanding the dynamics of skyrmion nucleation and manipulation is important for applications in spintronic devices. As described further herein, the spin textures at magnetic domain-boundaries are investigated using LTEM by application of in-plane magnetic fields in a centrosymmetric kagome ferromagnet, $Fe_3Sn_2$, with thickness gradient. Switching of the in-plane magnetic field is shown to induce a reversible transformation from magnetic stripes to skyrmions, or vice versa, at the interface between differently oriented domains. Additionally, it is shown that the helicity of skyrmions can also be controlled using this dynamic process. Results suggest that magnetic materials with rotatable anisotropy are potential skyrmionic systems and provide an ability for manipulation of skyrmions in spintronic devices.

Magnetic skyrmions are topologically protected particle-like spin textures that exist in several magnetic materials. Much skyrmion research has been focused on magnetic materials with broken inversion symmetry, where the Dzyaloshinskii-Moriya interaction (DMI) can be induced/adjusted to stabilize skyrmions with the assistance of external fields. Skyrmions in centrosymmetric materials can be stabilized by other mechanisms such as long-range dipolar interactions, competing exchange interactions and four-spin exchange interactions. Furthermore, skyrmions in centrosymmetric magnets can host a rich array of spin textures because they have a helicity/vorticity degree of freedom due to the absence of DMI. Skyrmions in such materials often exhibit better thermal stability due to higher magnetic ordering temperatures and stronger exchange interactions compared with DMI controlled systems. For example, skyrmion bubbles and target skyrmions have been identified in a frustrated kagome magnet, $Fe_3Sn_2$, over a record stable temperature range, 130-630 K. However, compared to materials with DMI, the higher magnetic fields necessary for nucleation of skyrmions in centrosymmetric magnets limit their applications. To overcome this, methods such as geometric confinement, temperature switching or stimulations such as applied current and laser excitation have been explored.

As described further herein, the dynamic switching of an applied in-plane magnetic field is used to manipulate magnetic textures in $Fe_3Sn_2$—a material that has attracted much interest due to its unusual physics and exotic correlated phenomena. LTEM is utilized for in-situ observation of the magnetic textures. It is shown that dynamic switching of a weak in-plane magnetic field can be used to induce reorientation of magnetic textures, resulting in an unexpected magnetic texture transformation from magnetic stripes to skyrmions, and vice versa, when geometrical asymmetry involved. Both bubbles and target skyrmions are observed in both experiment and simulation. The connection between in-plane field induced transformation and magnetic stripe domains suggests the class of materials that can host skyrmions may be extended to other centrosymmetric magnets with rotatable anisotropy. Furthermore, it is determined and described that the helicity of skyrmions can also be influenced using dynamic switching of in-plane fields, providing a new approach to control skyrmionics textures.

In LTEM, the objective lens (O.L.) is normally switched off so that the specimen, which is positioned between the upper and lower electromagnetic polepieces, is in a field-free environment. In an implementation, the specimen is loaded into the microscope with the O.L. switched off and then weakly excited to apply a small magnetic field (~70 mT) normal to the specimen. If the specimen is tilted with respect to this normal along one of the two orthogonal tilt axes ($\alpha$ and $\beta$), an in-plane magnetic field results with a component aligned with the direction of the tilt ($H_{\parallel,\alpha}$ and $H_{\parallel,\beta}$). In an implementation, an electron transparent specimen of $Fe_3Sn_2$ was prepared along the [001] direction from a liquid transport grown single crystal by focused ion beam milling. An annular dark field (ADF) scanning transmission electron microscope (STEM) may be used to obtain an image, with an indicated thickness gradient as determined by electron energy loss spectroscopy (EELS). To define the starting point for an experiment, a 5° tilt on the $\beta$-tilt axis is used to apply an in-plane field to align the magnetic stripe phase along this axis. While maintaining $\beta$=5°, the tilt on the orthogonal a-axis is increased stepwise from 0° to 15°. The observed LTEM images show a reorientation of magnetic stripes occurs, initially in the thinnest region and continuing to thicker regions, as the in-plane magnetic field $H_{\parallel,\alpha}$ increases. The spin direction in these stripes can be determined from the LTEM contrast. This kind of magnetic stripe reorientation has been reported previously in magnets with "rotatable anisotropy" where the threshold field for reorientation is related to the perpendicular magnetic anisotropy ($K_{PMA}$) energy density.

Micromagnetic modeling reveals that the competition between exchange constant ($A_{ex}$), $K_{PMA}$ and $M_S$, and the sample thickness determines the width of stripes and threshold fields for their reorientation, i.e., rotatable anisotropy. It has been determined that the periodicity of the stripe phase is strongly dependent on thickness. The pitch length is determined by the interplay between $A_{ex}$, $M_S$, K, and sample thickness t. It has been found that the pitch length $\lambda$ decreases with decreasing t or decreasing $A_{ex}$. There exists a critical thickness $t_c \propto \sqrt{A_{ex}}$ such that the stripe phase is unstable for t<$t_c$ and there is a saturated ferromagnetic phase with in-plane magnetization. Also, the stripe pitch length has a corresponding critical value $\lambda_c \sim t_c$ at $t_c$. As t decreases, there are two consequences: (i) $\lambda$ decreases and (ii) the in-plane component of spins increases. Also, the stripes become less stable as t approaches $t_c$. The instability and larger in-plane spin component cause a stronger response to the in-plane field for the system with a smaller thickness. The weaker threshold field in the thinner region is due to the increase of the in-plane component of spins resulting in decreased stripe widths and saturation field (MS). The trend of variation of the stripe width is consistent with observations in geometrically confined $Fe_3Sn_2$.

FIG. 1 is an operational flow of an implementation of a method 100 of skyrmion nucleation and manipulation.

At 110, a 'clear' status is generated in a spintronic material with a large in-plane field or a spin current pulse to initial the spin textures.

At 120, the skyrmion (or skyrmions) may be nucleated with a stimulation of in-plane magnetic field or spin current pulses.

At 130, the skyrmion (or skyrmions) may be manipulated using the in-plane magnetic field or associated spin current pulses.

At 140, the nucleated skyrmion (or skyrmions) may be tuned in size, type, and/or stability with multitype of external stimulations.

At 150, the skyrmion(s) may be detected using topological Hall effect or magnetoresistance.

To nucleate skyrmions in magnetic materials, the external magnetic field is usually applied along the easy axis of the material. In the absence of geometric confinement, the critical field for nucleation of isolated skyrmions in $Fe_3Sn_2$ is ~800 mT. Simulations indicate that there is a critical sample thickness, ~150 nm, below which increasing magnetic field would make the stripe domains transform directly to a magnetic saturation state without formation of the skyrmion phase. This has been experimentally confirmed in samples herein. It is determined herein that the nucleation of skyrmions occurs when the in-plane field direction is switched. In an experiment, the sample has a thickness gradient aligned along β-tilt axis with an average thickness of ~100 nm. The in-plane field switching was achieved in the LTEM by continuously tilting the sample in both positive and negative directions along the α-tilt axis to create a dynamically varying in-plane magnetic field that reverses direction at 0° tilt angle within a normal field fixed at 20 mT. In this process, skyrmions are observed to nucleate/annihilate at the boundary created by the oscillating in-plane field between two different oriented magnetic stripe domains created by the oscillating in-plane field. LTEM images confirm the dependence of the magnetic texture transformation on the magnetic field strength during the in-plane field oscillation. The highest density of transformation events is observed when the normal field is ~20 mT, corresponding to an in-plane field ~5 mT.

To investigate the origin of the skyrmion nucleation, the influence of higher applied fields was investigated. Initially, the magnetic stripe phase was aligned along the β-tilt axis by application of a saturation magnetic field with β-tilt axis of 2°. The normal magnetic field was then decreased to 30 mT while maintaining β=2°. An oscillating in-plane field $H_{\parallel,\alpha}$, ±7.8 mT, was created by continuously oscillating the specimen ±15° along the α-tilt axis. After the in-plane field oscillation, the initial magnetic stripe phase is transformed to mixed magnetic textures with a rich array of magnetic textures with a skyrmion co-existing with two types of magnetic stripes (type I and type II) decorated with π Bloch lines (π-BLs). The type I stripes are defined as the narrow stripe domains bounded by antiparallel Bloch walls while the one for type II stripes is bounded by two parallel Bloch walls, and Bloch lines that with the spin rotation ±180° across each line are named the π-BLs. While maintaining β=2°, the evolution of the mixed magnetic textures was investigated as the magnitude of the normal magnetic field was increased to 170 and 200 mT, which corresponds to in-plane fields along β-tilt axis of 5.9 and 7.0 mT, respectively. Under these conditions, the type II stripes became dominant. They tend to align parallel to the in-plane field and are terminated by π-BLs. Increasing the in-plane fields moves the π-BLs with opposite topological charge to opposite directions in domain walls. This suggests that the skyrmion nucleated is not created by pair-annihilation of two π-BLs with opposite topological charges under the increasing normal magnetic fields as reported in other magnets.

The robustness of the skyrmions to applied external fields has also been determined, as skyrmions nucleated in this approach not only exist under zero-field, but remain at the higher magnetic field. Furthermore, the radii of the skyrmions decreases as the external magnetic field strength increases. For example, in an implementation, despite an elongation in the in-plane field direction, the skyrmion still shows topological integrity at 170 mT with average radius (72±13 nm) that is about half the size of skyrmions (~130 nm) reported in previous studies at 140 mT. The skyrmion size in centrosymmetric magnets are determined by the competition between $A_{ex}$, $K_{PMA}$, and $M_S$, which can be thickness dependent. It has been determined herein that it is possible to control the size of target skyrmions using these parameters.

The dynamic process of transformation from stripe domains to skyrmions and vice versa, was probed in the LTEM. The types of magnetic texture observed is highly sensitive to small changes of the in-plane field. However, because it is a dynamic process, obtaining high resolution and focal series images with clear magnetic contrast at each value of the in-plane field is challenging and limits the ability to accurately identify each magnetic texture observed. To overcome this and confirm the role of in-plane fields in the dynamic switching process, micromagnetic simulations were performed as described further herein.

A sample, 5×2.5 μm, with a thickness gradient from 128 nm to 90 nm along the x-axis was simulated. The initial stripe phase was aligned along y-direction by annealing in an in-plane field $H_y$ that was lowered from 100 mT down to 2 mT. With decreasing sample thickness, (i) a decreasing stripe pitch and (ii) an increasing in-plane magnetization were observed. The latter is directly responsible for making the thinner region more sensitive to in-plane fields. Next the field, $H_y$, was reversed, switching from 2 mT to −10 mT. The thinner part of the sample begins to show a strong response when $H_y$ is around −7.3 mT, where one can see the in-plane component distortion due to in-plane field inversion. Because stripes parallel to the new in-plane field direction are energetically favorable, it has been observed that stripe direction inversion starts from the thinner end around −7.6 mT forming a target-like skyrmion array with paired skyrmion in opposite helicity. Increasing in-plane field to −8.0 mT will annihilate skyrmion with anticlockwise helicity and a domain wall forms between these "reversed" stripes (near the thin end of the sample) and the original stripes (in the thick part of the sample). The field-induced inversion of the in-plane component of the magnetization and its interplay with dipolar interactions leads to the creation of skyrmions near the boundary of domains. It was noted that some of the nucleated skyrmions are unstable and annihilated as the inverted stripe domain expands. However, skyrmions with clockwise helicity survived at higher field but are pushed to thicker region. As field increases and time goes, the in-plane inversed domain grows into thicker region, and skyrmion region also moves in this direction. In this process, long lived skyrmions can survive when the domain wall stops moving after the final value $H_y=-10$ mT of the external field is reached. After that, the external field is tuned back to −1 mT, but the domain boundary and skyrmions remain stable, consistent with the experimental results. Furthermore, skyrmions nucleated in thicker region that with anticlockwise helicity are more robust to in-plane fields than their counterparts in thinner regions.

Figure 2:
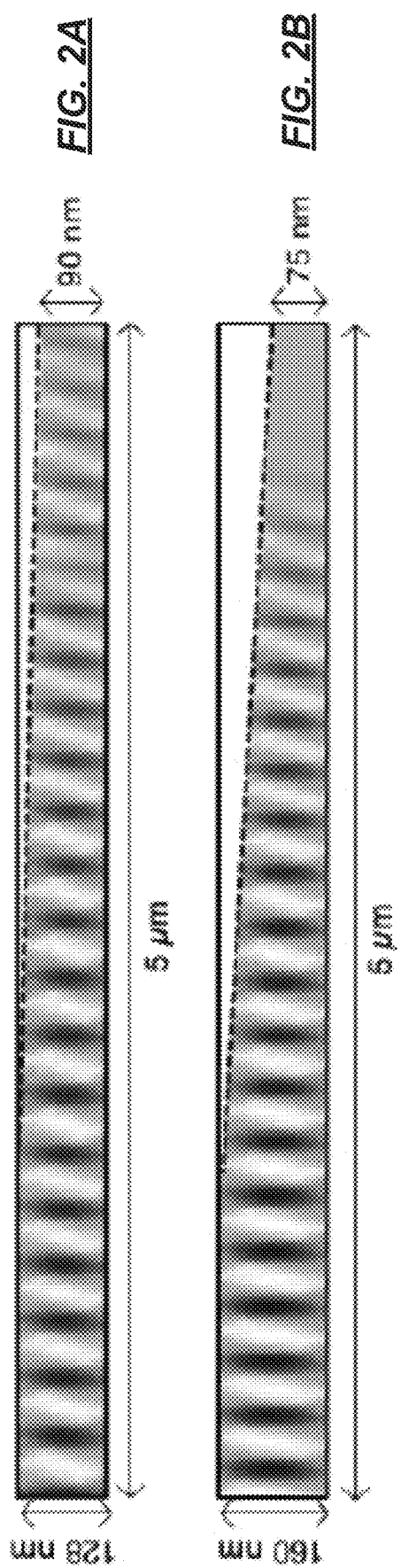
FIGS. 2A and 2B illustrate diagrams of implementations of side views of models with different thickness gradients, respectively, used in micromagnetic simulations.

FIGS. 2A and 2B illustrate diagrams of implementations of side views of models with different thickness gradients, respectively, used in micromagnetic simulations. It is clear that the thickness gradient plays an important role for both skyrmion nucleation and stability. While a gradient is necessary to nucleate skyrmions, too large a gradient will lead to a short skyrmion lifetime. The simulations have different thickness gradients, as shown in FIGS. 2A and 2B, and the thickness increases from right to left in the images. Some skyrmions are stable for hundreds of seconds as the in-plane field is reduced, while the skyrmions are unstable in other implementations. These differences arise from different thickness gradients. A smaller gradient provides a larger region for skyrmions to survive near the domain boundary. A larger intermediate region allows stripes to distort and forms complicated textures such as swirls and target skyrmions. In contrast, the larger gradient provides only a narrow region between domains and the skyrmion lifetime is decreased.

The skyrmion formation time scale of varying in-plane field has also been studied in modeling where different time scales of varying fields were applied. In an example, it takes 800 ns for the field to change from 2 mT to −10 mT. Although the simulations are limited by time and computational power to the same time scale as experiments, qualitative study of the trend provides insight into the mechanism. The stripes are more ordered and fewer skyrmions are stabilized. This is consistent with the experimental observation that skyrmions are easy to nucleate under a rapid switching field.

The result of the micromagnetic simulations provides insight into the connection between the nucleation process and the helicity of the skyrmion formed. The stripes are initially aligned to (−α)-direction under $H_{\parallel,-\alpha}$. When a weaker magnetic field $H_{\parallel,+\alpha}$ is applied in the opposite direction, the stripes in the thin region reorient to (+α)-direction. Therefore, a stripe domain boundary forms perpendicular to the thickness gradient direction because the reorientation critical field is thickness dependent. In this dynamic process, the domain boundary (type I stripe) transforms to a skyrmion with clockwise (CW) helicity under the dipole-dipole interactions because spin helices with the opposite direction of magnetization tend to attract each other. Changing the relative strength of the in-plane field and the sequence can reverse the skyrmion helicity to anticlockwise (ACW).

An experimental demonstration of helicity control has been performed. The specimen has a thickness gradient aligned along β-tilt direction and the in-plane field will be oscillated in the orthogonal direction i.e., aligned with the α-tilt axis. The starting point for this experiment is that the sample is tilted +5° along α-tilt axis. Consequently, an oscillation of ±15° a-tilt corresponds to a tilt ranging from −10° to +20° relative to the normal direction. This means that maximum in-plane field is asymmetric, varying in magnitude by ~5 mT under a normal field of 30 mT. When the direction of normal field is reversed, i.e., −30 mT, the magnitude of the asymmetric in-plane field is also reversed. The results show that the majority of the skyrmionic bubbles nucleate with opposite helicity when the relative strength of the in-plane fields along opposite tilt directions are reversed. Some exceptions may arise because of microstructural defects and sample inhomogeneities such as thickness variations or bending, but skyrmion types can be controlled by thickness gradient as discussed in modeling at varied thickness gradient.

Micromagnetic simulations are described, performed using Mumax3. Formation of skyrmions was studied, along with width of stripes. For both cases, use the following parameters: saturation magnetization $M_s$=556 kA/m and uniaxial anisotropy $K_u$=45 kJ/m³ for the simulation on the formation of skyrmions. The simulations for skyrmion formation have exchange stiffness $A_{ex}$=1.4×10⁻¹¹ J/m, while, for the simulation on stripe period, choose the exchange stiffness $A_{ex}$ in the range between 7×10⁻¹² J/m and 1.12×10⁻¹⁰ J/m to see how the period of stripes changes with $A_{ex}$. Choose the damping coefficient α for faster responses in the simulation. There is no Dzyaloshinskii-Moriya interaction, so the stripes and skyrmions results from only the interplay between dipolar field, exchange and anisotropy. The initial configurations were prepared by annealing from high transverse field to low transverse field (2 mT), so the direction of the stripes and the in-plane magnetization is pinned along the field direction. For the simulation on skyrmion formation, the systems have varying thicknesses along the x direction. In contrast, the thickness in stripe width simulations is uniform. Periodic boundary conditions were used along the y-axis, while the x-axis and the z-axis had open boundary conditions. It should be noted that the simulations are limited by time and computational power. Thus, it is impossible to simulate on the same time scale as experiments. Also, the model is course-grained, discretized, and finite-sized, so the simulation time scale could not be related to the real experiment directly. However, qualitative study of the trend gives insight into the mechanism.

Thus, the magnetic texture transformation in a centrosymmetric magnet $Fe_3Sn_2$ with an engineered thickness gradient has been investigated using LTEM and techniques for skyrmion nucleation are described herein. It has been determined that by switching in-plane magnetic field it is possible to nucleate and manipulate skyrmions at values much less than the reported critical magnetic field for this material. This provides broadened potential to design spintronic nanodevices. For example, in a designed nanostructure with asymmetry response to field, a local field switch can be applied to nucleate skyrmions, which then can be pushed onto a racetrack device using an electric current. Micromagnetic simulations and associated experiments reveal that the thickness dependence of the response to the external in-plane field is the main factor for the skyrmion formation. The observations indicate that magnets with rotatable anisotropy may be a promising new class of skyrmionic materials. Meanwhile, the skyrmions nucleated using the methods described herein can be much smaller than those reported previously because pitch length decreases with decreasing thickness. Although such transformations are sensitive to in-plane fields, the skyrmions nucleated in this process are robust to magnetic field in the normal direction and their size, type, and stability are tunable by engineering an appropriate thickness gradient.

The techniques described herein provide for the creation of entirely new forms of computation and other applications. One example is a single skyrmion racetrack device where a skyrmion can be created or deleted by a locally in-plane field switching in a nanostructure with varied field response. Because skyrmions can be manipulated using ultra-low current densities and they can be detected using topological Hall effect or tunnel magnetoresistance, such a single skyrmion unit-cell can be promising for low-power memory and/or logic architectures where bit (0 or 1) can be recorded as a skyrmion position.

Figure 3:
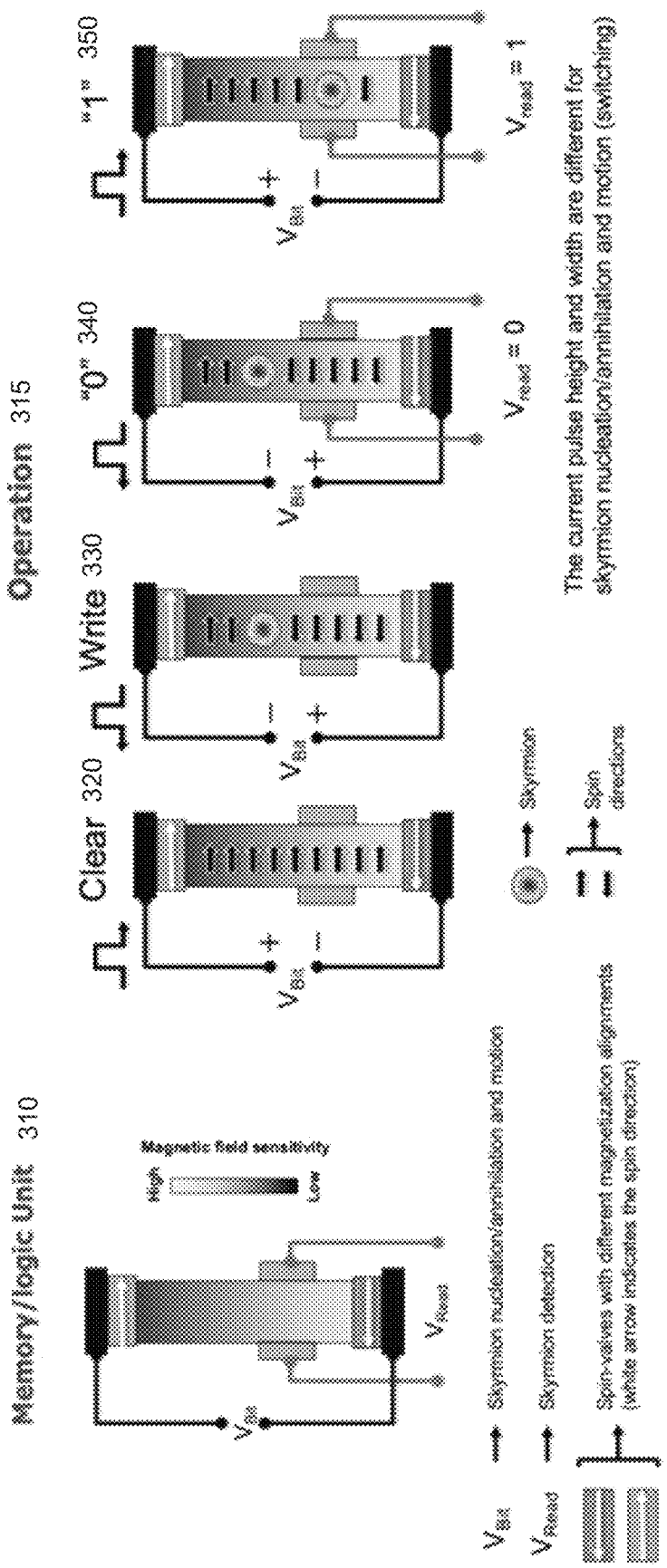
FIG. 3 shows a diagram of an implementation of a single skyrmion racetrack with low writing energies for nonvolatile switch.

FIG. 3 shows a diagram of an implementation 300 of a single skyrmion racetrack with low writing energies for nonvolatile switch. A memory/logic unit 310 is shown that uses spin valves. Spin currents with different magnetizations can be input into the racetrack by transient current pulses. Four operations 315 on a single skyrmion track are shown. In the "clear" state 320, a transient current pulse will be sent through $V_{Bit}$ to make the magnetization in the same direction in the racetrack; in the "write" state 330, an opposite transient current pulse will be sent through $V_{Bit}$ to redirect spin textures in the racetrack, thereby nucleating skyrmions with opposite spin orientations in the domain boundaries; the position of skyrmions can then be changed by switching of transient current pulses, where bits 0 (340) or 1 (350) can be recorded as the skyrmion location.

Figure 4:
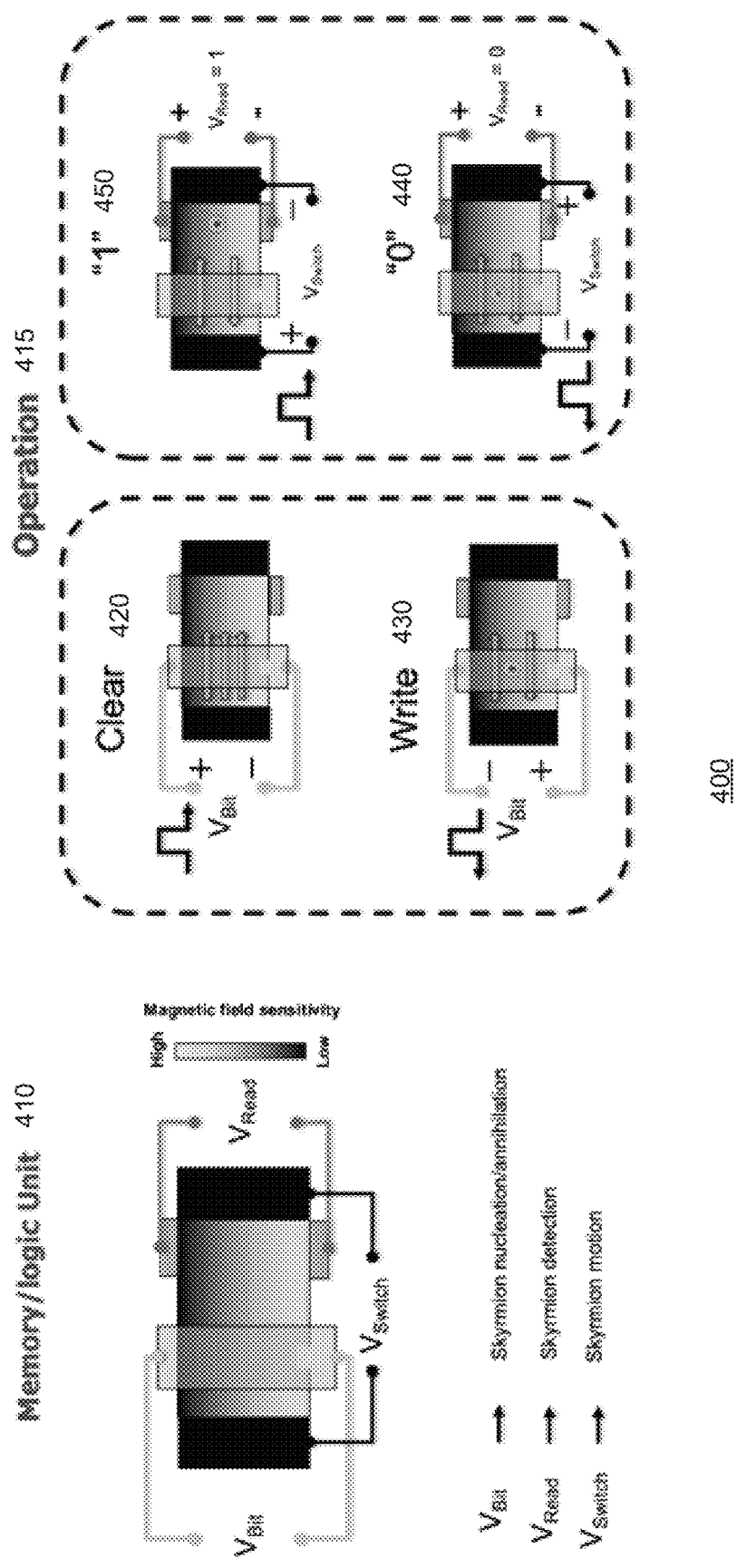
FIG. 4 shows a diagram of another implementation of a single skyrmion racetrack with low writing energies for nonvolatile switch.

FIG. 4 shows a diagram of another implementation 400 of a single skyrmion racetrack with low writing energies for nonvolatile switch. A single skyrmion racetrack memory/logic unit 410 is shown. The $V_{Bit}$ is used to create skyrmion using transient local magnetic field stimulation; the $V_{Switch}$ is used to move the nucleated skyrmion; and $V_{Read}$ is used to detect skyrmion. Four operations 415 on a single skyrmion track are shown. In the "clear" state 420, a strong transient current pulse will be sent through $V_{Bit}$ to align the magnetization in the same direction in the racetrack; in the "write" state 430, an opposite transient current pulse will be sent through $V_{Bit}$ to redirect spin textures in the racetrack, thereby nucleating skyrmions with opposite spin orientations in the domain boundaries; the position of skyrmions can then be changed by switching of transient current pulses through $V_{Switch}$, where bits 0 (440) or 1 (450) can be recorded through $V_{Read}$ as the skyrmion location.

Figure 5:
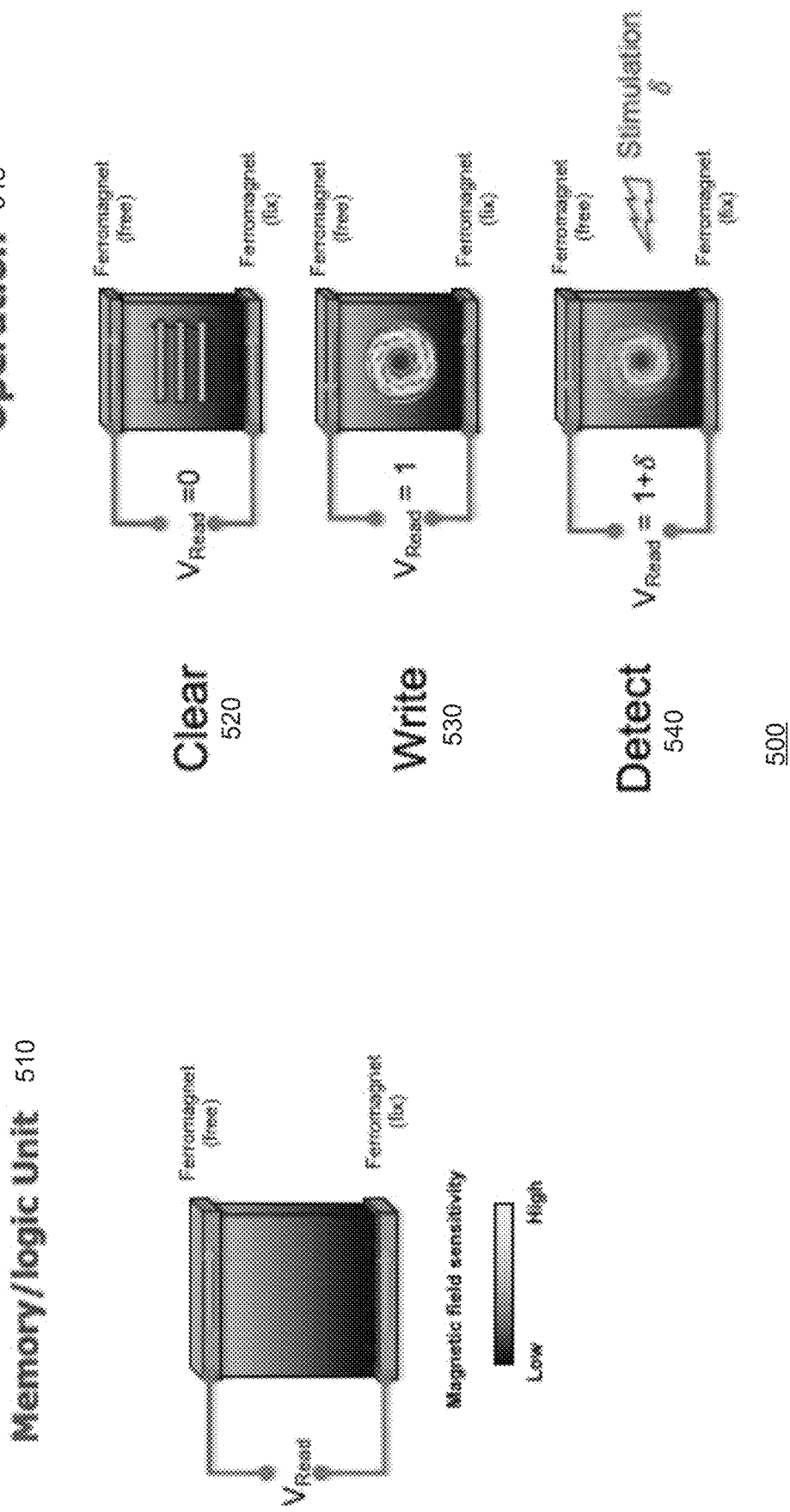
FIG. 5 shows a diagram of an implementation of a single skyrmion unit cell.

Another example is the skyrmion unit cell device, where a skyrmion can be nucleated in a nanostructure similar to its size. It can work as a skyrmion unit for memory, logic, or microwave detector. FIG. 5 shows a diagram of an implementation 500 of a single skyrmion unit cell 510 with operations 515 comprising a "clear" state 520, a "write" state 530, and a "detect" state 540.

In an implementation, a method comprises: generating a skyrmion in a spintronic material; applying an in-plane magnetic field to the spintronic material; and nucleating the skyrmion by manipulation of the in-plane magnetic field or spin current pulses.

Implementations may include some or all of the following features. The method further comprises manipulating the skyrmion using the in-plane field or spin current pulses. Nucleating the skyrmion comprises switching the in-plane field or spin current pulses. The spintronic material is a material with rotatable anisotropy and asymmetry geometric confinement. The material is a centrosymmetric magnet, $Fe_3Sn_2$, with an engineered thickness gradient. The method further comprises nucleating a plurality of isolated skyrmions in $Fe_3Sn_2$ using in-plane fields <5 mT. The nucleated skyrmions are tunable in at least one of size, type, or stability. The method further comprises tuning the nucleated skyrmion in at least one of size, type, or stability. The method further comprises detecting the nucleated skyrmion using topological Hall effect or tunnel magnetoresistance.

In an implementation, a device for spintronic memory and processing comprises: a spintronic material; and a skyrmion disposed within the spintronic material.

Implementations may include some or all of the following features. The device is a single skyrmion racetrack device configured so that the skyrmion can be created or deleted by a locally in-plane field switching. The switching is in a nanostructure with a varied field response. The device is a skyrmion unit cell device. The skyrmion can be nucleated in a nanostructure similar to a size of the skyrmion. The skyrmion can be manipulated using ultra-low current densities and can be detected using topological Hall effect or tunnel magnetoresistance. The skyrmion unit cell device is configured as a low-power memory. The skyrmion unit cell device is configured as a logic architecture where bit (0 or 1) can be recorded as a skyrmion position. The device is configured as a skyrmion unit for a memory, a logic, or a microwave detector. The spintronic material is a material with rotatable anisotropy and asymmetry geometric confinement. The material is a centrosymmetric magnet, $Fe_3Sn_2$, with an engineered thickness gradient.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method comprising:
   generating a skyrmion memory in a spintronic material;
   applying an in-plane magnetic field to the spintronic material; and
   nucleating the skyrmion memory by manipulation of the in-plane magnetic field or spin current pulses,
   wherein the spintronic material is a centrosymmetric magnet, $Fe_3Sn_2$, with an engineered thickness gradient.

2. The method of claim 1, further comprising manipulating the skyrmion using the in-plane field or spin current pulses.

3. The method of claim 1, wherein nucleating the skyrmion comprises switching the in-plane field or spin current pulses.

4. The method of claim 3, wherein the spintronic material is a material with rotatable anisotropy and asymmetry geometric confinement.

5. The method of claim 1, further comprising nucleating a plurality of isolated skyrmions in $Fe_3Sn_2$ using in-plane fields <5 mT.

6. The method of claim 5, wherein the nucleated skyrmions are tunable in at least one of size, type, or stability.

7. The method of claim 1, further comprising tuning the nucleated skyrmion in at least one of size, type, or stability.

8. The method of claim 1, further comprising detecting the nucleated skyrmion using topological Hall effect or tunnel magnetoresistance.

9. A device for spintronic memory and processing, comprising:
   a spintronic material configured to generate a skyrmion and to which an in-plane magnetic field is applied; and
   a skyrmion disposed within the spintronic material that is configured to be nucleated by manipulation of the in-plane magnetic field or spin current pulses,
   wherein the spintronic material is a centrosymmetric magnet, $Fe_3Sn_2$, with an engineered thickness gradient.

10. The device of claim 9, wherein the device is a single skyrmion racetrack device configured so that the skyrmion can be created or deleted by a locally in-plane field switching.

11. The device of claim 10, wherein the switching is in a nanostructure with a varied field response.

12. The device of claim 9, wherein the device is a skyrmion unit cell device.

13. The device of claim 12, wherein the skyrmion can be nucleated in a nanostructure similar to a size of the skyrmion.

14. The device of claim 12, wherein the skyrmion can be manipulated using ultra-low current densities and can be detected using topological Hall effect or tunnel magnetoresistance.

15. The device of claim 12, wherein the skyrmion unit cell device is configured as a low-power memory.

16. The device of claim 12, wherein the skyrmion unit cell device is configured as a logic architecture where bit (0 or 1) can be recorded as a skyrmion position.

17. The device of claim 9, wherein the device is configured as a skyrmion unit for a memory, a logic, or a microwave detector.

18. The device of claim 9, wherein the spintronic material is a material with rotatable anisotropy and asymmetry geometric confinement.

* * * * *